United States Patent [19]

Selle et al.

[11] Patent Number: 4,889,821
[45] Date of Patent: Dec. 26, 1989

[54] METHOD OF MANUFACTURING A SEMICONDUCTOR DEVICE OF THE HETERO-JUNCTION BIPOLAR TRANSISTOR TYPE

[75] Inventors: Daniel Selle, Brunoy; Philippe Boissenot, Paris, both of France

[73] Assignee: U.S. Philips Corp., New York, N.Y.

[21] Appl. No.: 290,926

[22] Filed: Dec. 28, 1988

[30] Foreign Application Priority Data

Dec. 30, 1987 [FR] France ................................ 87 18392

[51] Int. Cl.$^4$ ..................... H01L 29/72; H01L 21/28
[52] U.S. Cl. ...................................... 437/31; 437/944; 437/917; 437/32; 148/DIG. 100; 148/DIG. 10; 357/71; 357/35
[58] Field of Search ..................... 437/31, 32, 33, 909, 437/917, 187, 26, 944; 357/34, 35, 23.4, 16, 43, 71; 148/DIG. 10, DIG. 11, DIG. 72, DIG. 100

[56] References Cited

U.S. PATENT DOCUMENTS

3,627,647 12/1971 Reuter ................................ 437/909
4,032,957 6/1977 Yagi et al. ........................... 357/34
4,130,826 12/1978 Bachle et al. ........................ 357/34
4,818,712 4/1989 Tully .................................... 357/35

Primary Examiner—Brian E. Hearn
Assistant Examiner—Tuan Nguyen
Attorney, Agent, or Firm—Steven R. Biren

[57] ABSTRACT

A method of manufacturing a hetero-junction bipolar transistor especially of gallium arsenide comprising the formation of epitaxial layers superimposed to obtain a collector layer (1) of the n+ type, an emitter layer (3) of the n-type, the formation of localized implantations of the p+ type to obtain the base region (31, 30) or of the n+ type to form collector contact islands (20). This method also including the formation of base contacts B (70) having the dimensions $B_0$ and located at a relative distance of $E_1$, then covering the metallization (70) of pads (81) of silica ($Si_3N_4$) having edges perpendicular to the plane of the layers on which bear spacers of silicon nitride ($Si_3N_4$) (52) having dimensions $h_1$ defining with a high precision the dimension $E_0 = B_1 - 2h$ of the emitter contact E and the distances between the different collector (90), base (70) and emitter (90) contacts C, B and E, respectively.

14 Claims, 6 Drawing Sheets

METHOD OF MANUFACTURING A SEMICONDUCTOR DEVICE OF THE HETERO-JUNCTION BIPOLAR TRANSISTOR TYPE

BACKGROUND OF THE INVENTION

The invention relates to a method of manufacturing a semiconductor device of the hetero-junction bipolar transistor type having a planar structure, this method comprising at least the step of manufacturing a structure comprising successively at least one collector layer of a binary material of a first conductivity type, a base layer of a binary material of the second conductivity type opposite to the first type, an emitter layer of ternary material of the first conductivity type and a binary highly doped contact layer of the first conductivity type.

The invention is used in the manufacture of integrated circuits on materials of the III-V group and especially on gallium aresenide including hetero-junction bipolar transistors.

A hetero-junction bipolar transistor having a planar structure is already known from the publication entitled "A Fully Planar Hetero-junction Bipolar Transistor" by John W. Tully et alii in "I.E.E.E. Electron Device Letters", Vol. EDL 7, No. 11, November 1986, pp. 615-617.

This document describes a transistor formed on a semiconductor substrate of the n+conductivity type. This transistor comprises a first layer of GaAs of the n+type, a second layer of GaAs of the n-type and a base layer of the p+type formed by localized implantation in the upper part of the layer of n-type GaAs.

This transistor further comprises two upper layers, the first layer of FaAlAs of the n-type to form the emitter and the second layer of GaAs of the n+type to permit the connection of the contacts. The base regions are constituted by p+islands connecting the base contacts to an implanted p+layer.

The method of manufacturing this transistor begins with the epitaxial growth of the n+and n collector layers by the so-called MOCVD method. The base region is defined by a photoresist mask and is implanted selectively by means of Zn+ions. After elimination of the photoresist layer, the substrate is reinserted into the MOCVD reactor for an annealing treatment at high temperature. This operation is immediately followed by the growth of the n-type emitter layer of GaAlAs and the n+type contact layer of GaAs. The emitter layer having the composition $Ga_{1-x}Al_xAs$ has a gradient of the concentration x of Al. In the first 50 nm, the concentration x lies between 0 and 0.30. Subsequently, the remaining part of the emitter layer is formed with x =0.30 of Al. Subsequently, the device is covered by $SiO_2$ and then by a layer of Al having each a thickness of 400 nm. The base contacts are defined by photolithography and the aluminum is chemically etched, whereupon the layer of $SiO_2$ is etched by plasma. This method results in a stronger etching of $SiO_2$ than that of Al, as a result of which a projection is obtained above $SiO_2$. This method later serves for the "lift-off" of the aluminum. The upper layer of GaAs is thus uncovered and Zn+ions are implanted in the openings of $Al/SiO_2$. Subsequently, a metal apt to form a p-type contact, such as Mo/Cr, is evaporated. At this stage of the method, the aluminum is eliminated chemically, which permits of eliminating the excess of Mo/Cr. After the "lift-off", the sample is annealed at high temperature to activate the p+implantation. Finally, the emitter and collector contacts defined by photolithography are formed simultaneously by means of metallization of AuGe/Ni/Au the excess metal is eliminated and its contacts are annealed.

In this known method, the emitter and collector metallizations are "simply aligned" with respect to the base metallization. This type of alignment leads to a precision of hardly more than 1 $\mu$m. This results in that the distances between the emitter and base metallizations and the distances between the collector and base metallizations are at least equal to 1 $\mu$m. In these conditions, the transistors have dimensions too large to be compatible with the performances required for the envisaged application.

SUMMARY OF THE INVENTION

On the contrary, the present invention proposes a method of manufacturing which permits of obtaining a "self-alignment" of the emitter and collector contacts with respect to the base contacts, from which results the possibility of forming:

an emitter of submicron dimensions,
distances between electrodes which are extremely small and have extremely precise dimensions.

These advantages are due to the fact that the method according to the invention utilizes for the definition of the base regions a method based on the formation of spacers which is extremely precise and repetitive.

This results in that the transistors obtained according to the invention:

are extremely compact, i.e. have very small dimensions, and permit an integration at high density,
have very repetitive dimensions from one transistor to the other hence a very small dispersion of their characteristics.

This object is achieved by means of a method of the kind described above and moreover comprising the steps of:

(a) depositing a layer of silicon nitride ($Si_3N_4$), (b) positioning a mask $MK_2$ defining openings normal to the base regions and etching the layer of silicon nitride ($Si_3N_4$) through these openings until the surface of the contact layer is exposed by a method which permits of obtaining etching edges perpendicular to the plane of the layer, thus forming in the nitride openings remote from each other.

(c) localized implantation of ions of the second conductivity type through the openings of the nitride layer with an energy sufficient to attain the base layer so as to form islands of the second conductivity type connecting the base layer to the surface of the contact layer.

(d) depositing a metallic layer which is formed in the openings as well as on the remaining parts of the nitride ($Si_3N_3$) layer.

(e) forming a layer of silica ($SiO_2$) of very large thickness and then planarizing through a known method the device thus obtained down to the upper level of the nitride ($Si_3N_4$) layer by reactive ion etching (RIE) and ion matching, (f) selectively etching the remaining parts of the nitride ($Si_3N_4$) layer to maintain bond pads of silica ($SiO_2$) covering the base metallizations, (g) depositing a fresh layer of silicon nitride ($Si_3N_4$) and forming by a known method spacers formed in this new layer of nitride, which spacers bear on the edges of the silica (SiO₂) pads intended to reduce the distance between these pads of silica thus forming an opening defining the width of the emitter contact, these spacers also defining the distance between the collector, base and emitter electrodes, (h) depositing a metallic layer suitable to form the emitter and collector contacts, the pads of silica (SiO₂) and the spacers serving as masks, and then eliminating these dielectric parts.

(i) localized ion implantation between the collector, base and emitter contacts serving as masks of species suitable to form insulating islands between these electrodes with an energy permitting of attaining the upper surface of the emitter layer of the first conductivity type.

BRIEF DESCRIPTION OF THE DRAWING

The invention will be understood more clearly by means of the following description illustrated by the accompanying Figures, of which.

DESCRIPTION OF THE PREFERRED EMBODIMENTS

Figure 1A:
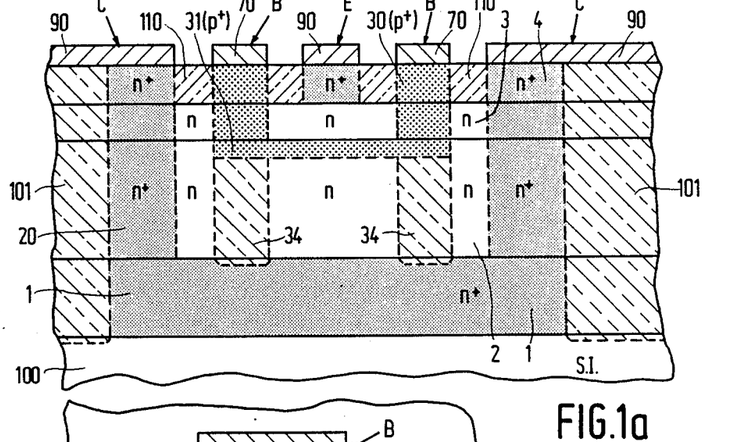
FIG. 1a shows in diagrammatic sectional view the heterojunction planar bipolar transistor obtained by the method according to the invention.

As shown in FIG. 1a in an embodiment, the device according to the invention first comprises a layer 1 of gallium arsenide (GaAs) of n+conductivity type formed on a semi-insulating substrate 100 of a material of the III-V group.

This transistor further comprises a layer 2 of gallium arsenide (GaAs) of n-conductivity type. The layers 1 and 2 form the collector layers.

The said transistor moreover comprises a layer 3 of gallium aluminum arsenide (GaAlAs) of n-conductivity type, i.e. the emitter layer.

At the surface of the layer 3 an epitaxial layer 4 of gallium arsenide (GaAs) of n+conductivity type is present for connection of the collector and emitter contacts. This n+type layer 4 is connected to the n+type collector layer 1 through n+type islands 20 disposed under the collector contacts $C_1$.

At the surface of the layer 4, the metallic collector base and emitter contacts C, B and E, respectively, are formed.

Islands 40 of the p+conductivity type connected through a layer 31 formed at the level of the surface of the layer 2 also of the p+conductivity type are formed in the layers 3 and 4 under the base contacts B.

The base contact is formed by means of metals, such as AuMn or AuBe. The emitter and collector contacts are formed by means of metals, such as: AuGe/Ni.

The insulation between the different electrodes is obtained by means of islands 110.

Figure 1B:
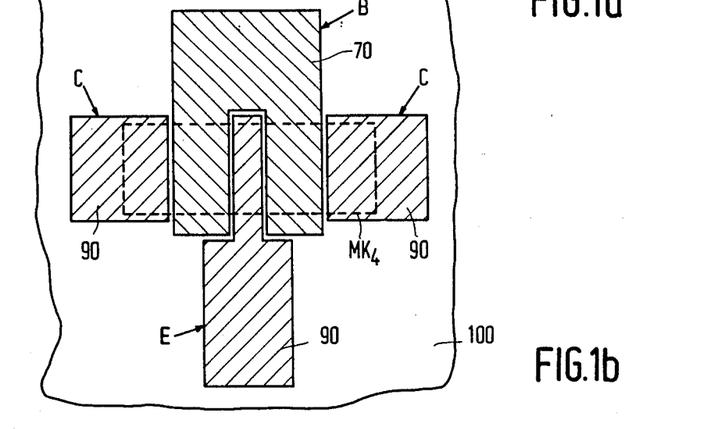
FIG. 1b shows this transistor in plan view.

This transistor has the advantage that it is absolutely planar. FIG. 1b shows in plan view moreover an interdigitated structure comprising two base fingers B and an emitter finger E. Further, a collector contact C is shown.

The method of manufacturing described below shows how to obtain such a transistor, whose emitter and collector contacts are self-aligned with respect to the base contacts, which permits of obtaining extremely small very precise and repetitive transverse dimensions and hence transistors of very small dimensions, whose performances are improved. As a result, the integration density can be increased and the performances of the circuits are also improved. The method of manufacturing according to the invention comprises at least the following steps:

(a) forming a substrate 100 of a material of the group III-V, which is monocrystalline and has an upper surface orientated, for example, in a crystallographic [100]direction. This substrate is chosen to be semi-insulating in order that the method is in synergy as to manufacture with the methods of manufacturing integrated circuits. In fact, the object aimed at by the invention is to obtain hetero-junction integrated transistors and not discrete transistors. The substrate will favorably be made of semi-insulating gallium arsenide (GaAs) obtained, for example by doping by means of iron (Fe) ions. The substrate can also be made of indium-doped annealed gallium arsenide, which permits of obtaining materials devoid of dislocations and compatible with the subsequent growth of epitaxial layers of the group III-V.

(b) forming two epitaxial planar layers of gallium arsenide to obtain the collector, in order of succession a layer 1 of n+conductivity type and a layer 2 of n-conductivity type. The epitaxial growth of these layers can be effected from the vapour phase or from the liquid phase. It will be effected preferably by a metal-organic (MOCVD) or MBE method. The layer 1 will have a thickness of 0.2 to 1 μm and preferably 0.5 μm. This layer 1 is of n+conductivity type obtained, for example, by a doping by means of silicon (Si) ions at about 3 to $5 \cdot 10^{18}$ ions/cm³ (cf. FIG. 2a). The optimum thickness of the layer 2 is 0.3 μm and the n-conductivity type is obtained, for example, by doping by means of silicon (Si) ions at $5 \cdot 10^{16}$ ions/cm³.

Figure 2A:
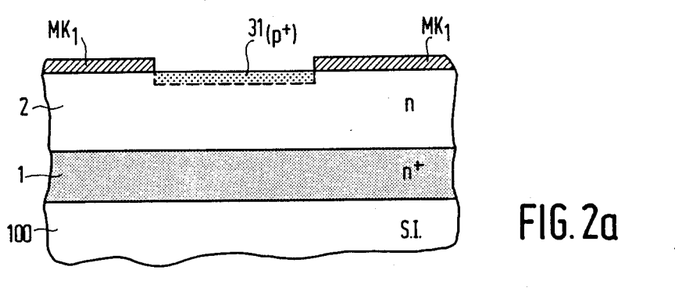
FIGS. 2a to 2n show the different stages of the method of manufacturing according to the invention.

(c) locally implanting into the superficial region of the second collector layer 2 p-type charge carriers to form a base layer 31 of the p+conductivity type (cf. FIG. 2a). For this purpose, a mask MK1, for example of photoresist, is formed at the surface of the layer 2 and an opening is provided in this mask at the surface of the region intended to form the base region. The layer 31 is formed by a shallow implantation (100 nm and less) of ions, such as Be, Mg or Zn. Further, a co-implantation of phasphor (P) with Mg or of F with Be can be obtained, which permits of improving the percentage of activation and of reducing the diffusion during the subsequent thermal treatments. The concentration of the implanted ions will be about $5 \cdot 10^{18}$ cm⁻³.

(d) forming two epitaxial planar superimposed layers, i.e. the first layer 3 of a ternary material of the group III-V, for example of gallium aluminum arsenide (GaAlAs) of n-conductivity type forming the emitter layer and the second layer 4 of a binary or ternary material, for example GaAs or GaInAs of the n+conductivity type for connecting the contacts. The epitaxial growth of these layers will be realized by the same method as that chosen for the growth of the layers 1 and 2 (cf. FIG. 2b). The emitter layer 3 will have a thickness of the order of 0.15 μm and the contact layer 4 will have a thickness of the order of 0.15 μm. The emitter layers 3 will be doped by means of ions, for example Si ions, at a concentration of the order of $5 \cdot 10^{17}$/cm³, and the contact layer 4 will be doped by means of Si ions at a concentration of $2 \cdot 10^{18}/cm^3$. The layer 3 of gallium aluminum arsenide (GaAlAs) will preferably have a concentration of 0.25 of aluminum.

(e) localized implantation into a region chosen to form the collector of n-type charge carriers at a depth suitable to obtain n+type islands 20 connecting the n+type collector layer 1 of gallium arsenide to the n+type layer 4 of gallium arsenide. This implantation will be effected in the opening of a mask $MK_3$ by means of ions, for example of Si, at a concentration of the order of $5 \cdot 10^{18}/cm^3$. At the end of this implantation, the mask $MK_3$ will be eliminated (cf. FIG. 2b).

Figure 2B:
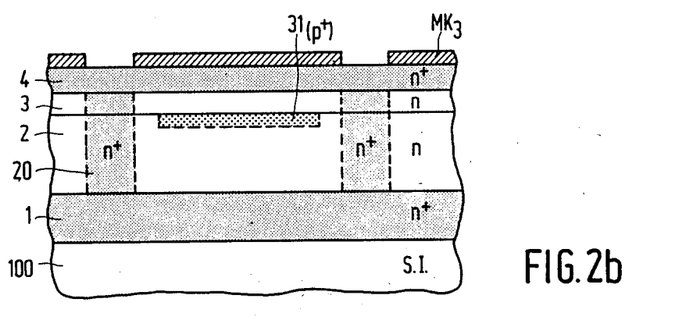

In order to obtain the desired flat profile at $5 \cdot 10^{18}/cm^3$, there will be proceeded by means of decreasing energies.

Figure 2C:
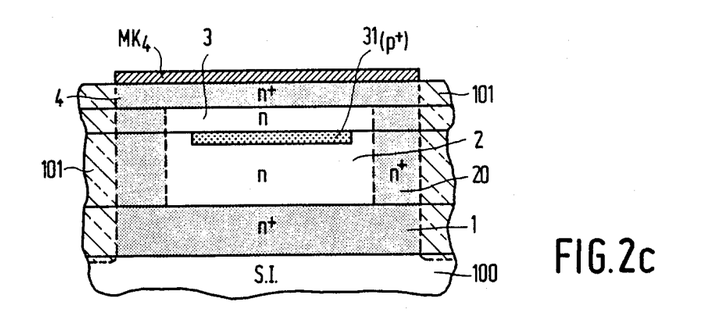
Figure 2D:
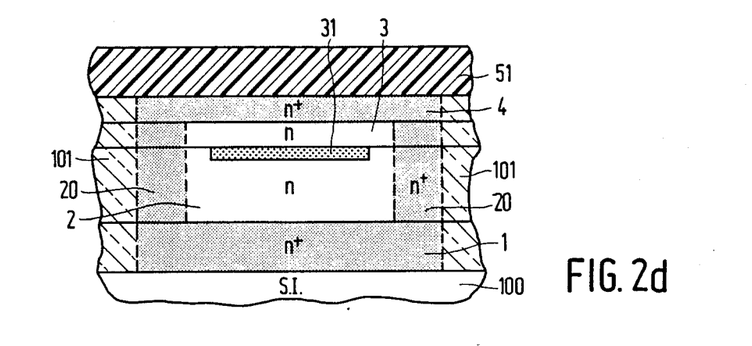
Figure 2E:
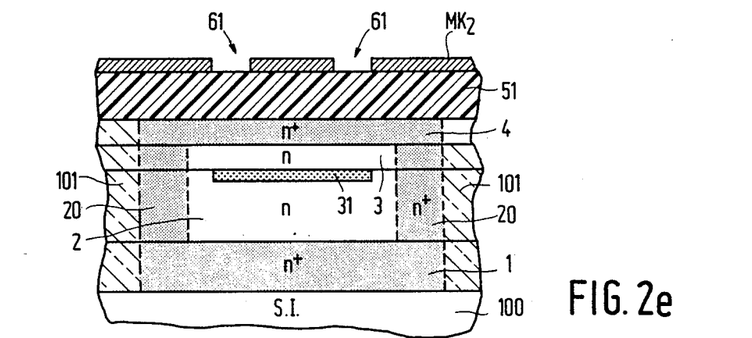

(f) Depositing a layer 51 of silicon nitride ($Si_3N_4$). This deposition is effected by chemical deposition from the vapour phase assisted by plasma (PECVD). This layer 51 of nitride favorably has a thickness of 0.6 to 1 $\mu$m (cf. FIG. 2d).

Figure 2F:
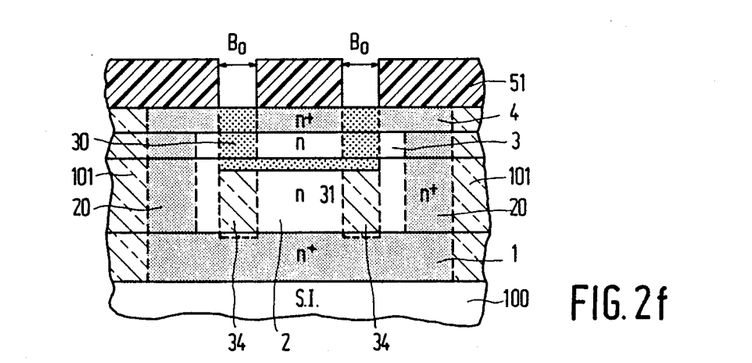

(g) Positioning a mask $MK_2$ of, for example, photoresist defining openings 61 normal to the base regions and etching the nitride layer 51 through these openings 61 until the surface of the layer 4 of gallium arsenide is exposed. This etching treatment is carried out by a method which permits of obtaining etching edges perpendicular to the plane of layer, for example by reactive ion etching (RIE) by means of $CHF_3$—$SF_6$ gases in the ratio 30 to 1. Thus, there are formed in the layer 51 openings having dimensions $B_0$ spaced apart by a distance $E_1$ (cf. FIGS. 3e and 2f).

(h) Localized implantation of p+type charge carriers through the openings $B_0$ with an energy sufficient to reach the base layer 31 to form p+type islands 30 connecting the base layer 31 to the surface of the n+type epitaxial layer. This implantation is effected in the same manner as in the step (c) by means of Mg or Be ions. A flat implantation profile is obtained by means of decreasing intensities until a concentration of a few $10^{19}$ $cm^{-3}$ is obtained.

The implantation annealing treatment can be effected at 850° C. for a few minutes to 10 minutes at arsine ($AsH_3$) pressure. However, the annealing treatment will preferably be of the "flash" type to minimize the diffusion phenomena and to improve the activation consisting in that the devices is brought to 900° C. for, for example, 3 seconds (cf. FIG. 2f).

Figure 2G:
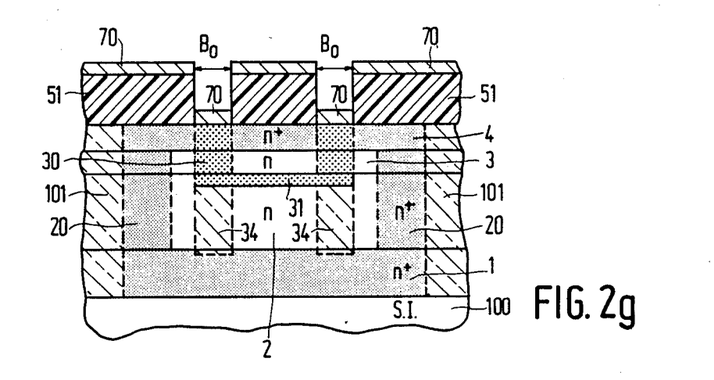

(i) Depositing a metallic layer 70 suitable to form the base contacts B (cf. FIG. 2g).

The metallic layer 70 can favourably be composed of gold-manganese (Au-Mn), of gold-beryllium (Au-Be), of gold-zinc (Au-Zn), preferably of Au-Mn at 4%, which permits of obtaining a contact of low resistivity. This layer is deposited not only in the openings $B_0$, but also at the surface of the nitride layer 51.

(j) Forming a very thick layer silica ($SiO_2$) at the surface of the whole device (cf. FIG. 2h) and then planarizing this device at the upper level of the nitride layer 51.

Figure 2H:
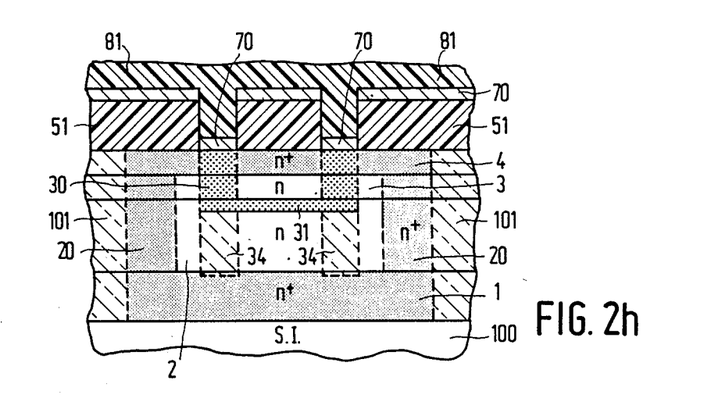

This planarization is effected in two steps. The first step consists in etching the silica layer 81 down to the level of the metallizations 70 covering the nitride layer 51. This etching treatment can be effected by RIE by means of $CHF_3$—$O_2$ with 30 SCCM for $CHF_3$ and 3 SCCM for $O_2$. The second step consists in eliminating the metallization parts 70 covering the nitride 51. This elimination is effected by ion machining by means of, for example, $Ar^+$ ions (argon plasma) at 400-600 eV.

For carrying out the method of planarizing the layer 81 of silica, it is recommendable to read the publication: "1984 5-MIC Conference, June 21–22" 1984 I.E.E.E. entitled: "Plasma Planarization with a non-planar Sacrificial Layer", pp. 37–44, or further "Journal Electrochemical Society, Solid State Science and Technology", Vol. 133, No 1, January 1986, the article entitled: "Two-Layer Planarization Process" by A. Schitzd et alii, pp. 178–181.

Figure 2I:
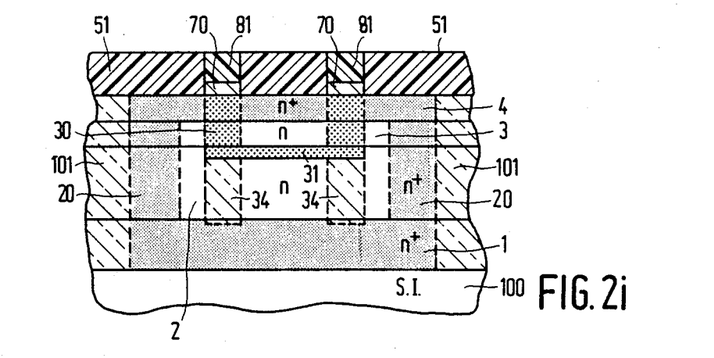

At the end of the planarization step by reactive ion etching of the dielectric layers and ion machining of the metallic parts 70, the device of the kind shown in FIG. 2i remains, in which the silica 81 fills the openings $B_0$ and is at same upper level as the nitride layer 51.

(k) selectively etching the nitride 51 to maintain in relief on the device the bond pads of silica 81 covering the base metallization 70, in the position of the openings $B_0$, these pads being spaced apart by $E_1$.

This selective etching step can be effected by RIE by means of $CHF_3$—$SF_6$ gases with 30 SCCM for $CHF_3$ and 1 SCCM for $SF_6$.

Figure 2J:
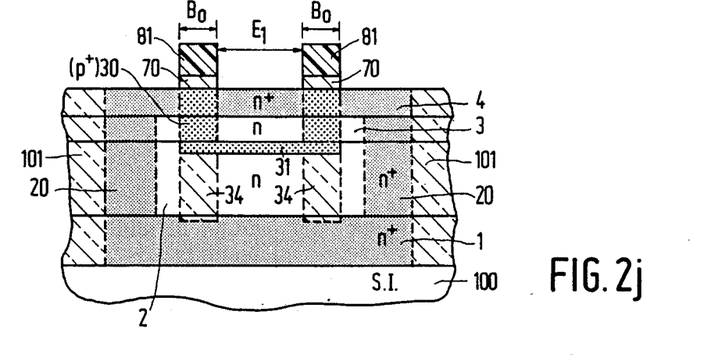

At the end of this step, on the upper surface of the layer 4 are formed in relief pads 81 of silica covering the base metallization 70, whose flanks are accurately perpendicular to the plane of the layers (cf. FIG. 2j) and space apart by $E_1$.

Figure 2K:
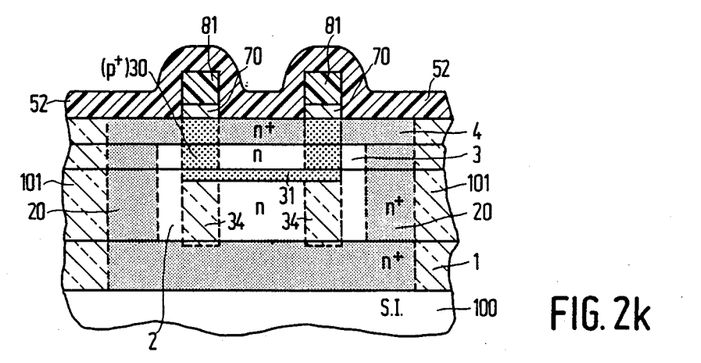
Figure 2L:
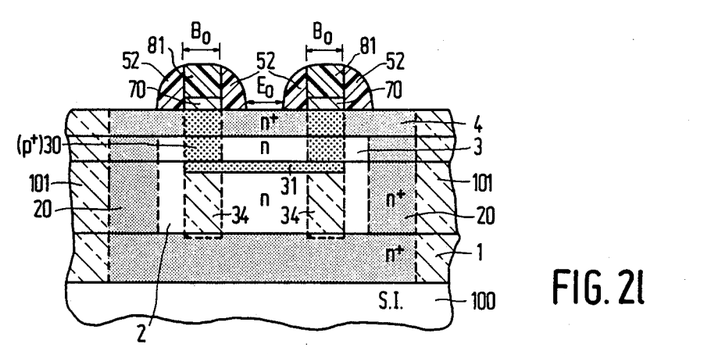
Figure 3A:
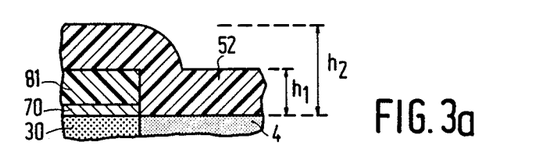
FIG. 3 shows the method of forming the spacers.
Figure 3B:
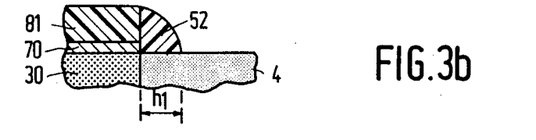

(l) Forming around the silica pads 81 spacers 52 of silicon nitride ($Si_3N_4$) (cf. FIGS. 2k and 2l). These spacers 52 are formed by means of a technique described in the publication entitled "Edge-Defined Patterning of Hyperfine Refractory Metal Silicide MOS Structure" by Shiniji Okazaki in I.E.E.E. Transactions on Electrons Devices, Vol. ED-28, No. 11, November 1981, pp. 1364–1368. The application of this technique for the formation of the present device is illustrated in FIGS. 3a and 3b. A layer 52 of dielectric material $Si_3N_4$ is deposited uniformly on the device in a very precise thickness $h_1$ chosen for the dimension of the spacers. The thickness of the layer 52 is therefore $h_1$, while the overall thickness of the layers 81, 70 and 52 is $h_2$. Further, a reactive ion etching treatment is effected on the device in such a manner that an identical thickness of the material 52 is removed at each point.

The thickness of material 52 being practically equal to $h_2$ along the edges of the opening $E_1$ in the layer 81 (cf. FIGS. 3a and 2k), after this etching treatment a part of the layer 52 remains along these sedges, which part is supported thereby and has the lateral dimension $h_1$ obtained with a precision $\simeq 1\%$ (cf. FIGS. 3b and 2l). The said remaining layer part 52 if designated as "spacer". The spacer servers to modify, for example, the limit of a mask. In this case, the spacers 52 modify the opening $E_1$ provided in the layer 81 (cf. FIG. 2j) and are formed so that an opening subsists which is equal to the emitter length $E_0$ desired for the transistor $E_0 = E_1 - 2h_1$, typically a dimension of the order of 0.5 $\mu$m. This method is extremely precise and repetitive contrarily to the prior art.

Moreover, the spacers 52 will also define with the same precision the distance $h_1$ between the base contacts B of metal 70 and the emitter contact E formed later as well as the distance between the base contacts B and the collector contacts C formed later.

In the embodiment described here, the thickness $h_1$ is chosen to lie between 0.1 and 0.3 $\mu$m.

The step of etching the layer 52 to obtain the spacers is effected preferably by RIE by means of $CHF_3$ (30 SCCM) and $SH_6$ (1 SCCM).

(m) Depositing a metallic layer 90 suitable to form the emitter and collector contacts E and C, respectively, the pads of the layer of silica 81 and the spacers 52 serving as a mask, and then eliminating the dielectric layers 81 and 52 of silica and silicon nitride, respectively. The emitter contact is formed in the opening $E_0$ and the collector contacts are formed on either side of the pads 81 (cf. FIGS. 1b and 2m).

Figure 2M:
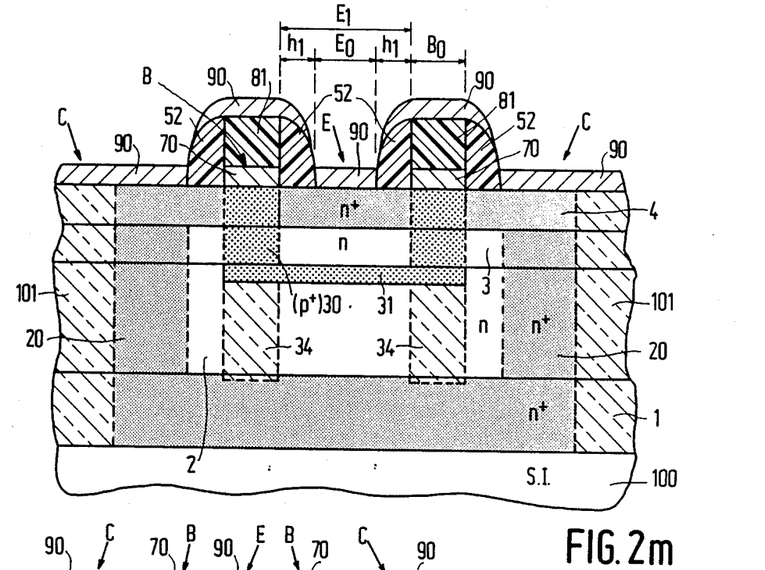

The metal for constituting the emitter and collector contact layer 90 will advantageously be a multilayer of the alloy Au-Ge on which is disposed a nickel layer (cf. FIG. 2m). The contact metallization 40 are subjected to an annealing treatment at about 400° C.

During the deposition, the metallic layer 90 has also covered by silica pads 81 and the nitride 52; this undesirable part of the layer 90 will be eliminated by "Lift-off" during the elimination of the silica and of the nitride, for example by means of a buffered HF solution.

Figure 2N:
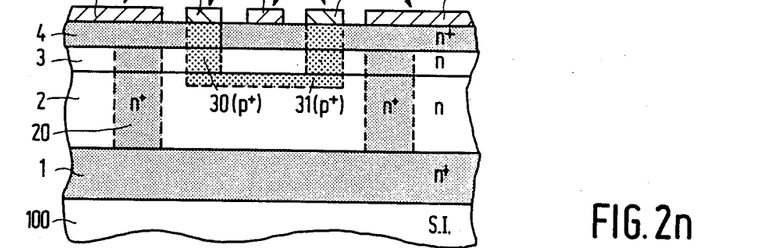

The device of the hetero-junction type having the required planar form is then obtained (cf. FIG. 2n). Moreover, this device has been obtained by the self-alignment of the collector-emitter contacts with respect to the base contact in a single operation consisting in that spacers of very precise dimensions are formed.

(n) localized ion implantation between the collector, base and emitter contacts C, B and E, respectively, serving as a mask of species suitable to form insulating islands 110 between these electrodes to avoid leakage currents with an energy permitting of reaching the upper surface of the n-type emitter layer 3. For this purpose, boron (B) ions or oxygen (O) ions or protons can be implanted at a concentration of about $2 \cdot 10^{18}$ cm$^{-3}$ (cf. FIG. 1a).

Thus, the device according to the invention has different advantages: Firstly, the use of a semi-insulating substrate of gallium arsenide permits it of being in synergy as to manufacture with other devices, such as field effect transistors, diodes etc..., while the use of the Si substrate also permits of eliminating the parasitic capacitances of the bond pads.

In variation of the invention, the semi-insulating substrate consists of gallium indium arsenide, which is obtained directly being semi-insulating by annealing and is particularly devoid of dislocations, as is known from European Patent Application EP-A-0176130.

On the other hand, in this variation, the collector layer 1 can be formed by ion implantation, for example with the use of selenium (Se) ions, directly into the semi-insulating substrate 100.

It should be noted that the fact that the very narrow emitter fingers are formed permits of improving the performances of the device. In fact, the equivalent circuit diagram of the transistor HBT shows a resistor in series with the base and a base-collector capacitance.

The frequency response of the transistor is determined by the product of the base resistance and the base-collector capacitance. The reduction of the dimensions of the transistor permits of reducing the product of these two factors and consequently of increasing the frequency response of the transistor. This results in that the latter then shows performances which are really and markedly improved with respect to the known prior art devices.

The method according to the invention can moreover comprise an insulating step for defining the transistor. For this purpose, a step (d') can be interposed between the step (d) and the step (e).

(d') Implantation of ions, favorably $O^{+l}$ ions, in the openings of a mask $MK_4$ covering the active zone (cf. FIG. 2c) except the periphery of the transistor. The ions are implanted into the peripheral insulation zones of the transistor.

It is already known from the prior art to implant boron (B) ions to obtain the insulation of the active zones. This type of boron implantation leads to defects and permits of insulating, for example, n- and p-type layers, which is necessary when the base layer is formed by epitaxy on the whole surface of the device and is not localized like in this case according to the invention to a perfectly defined layer 31.

In this case, the insulation by means of oxygen is preferably chosen to be boron insulation due to the fact that, if the latter should be chosen, its efficaciousness would disappear during annealing treatments at temperatures exceeding 500°-600° C. Now such annealing treatments at more than 600° C. are used later in the present method.

Thus, the boron insulation not being necessary because the base layer is defined by a method other than insulation, the oxygen insulation on the contrary is favorable.

Figure 4:
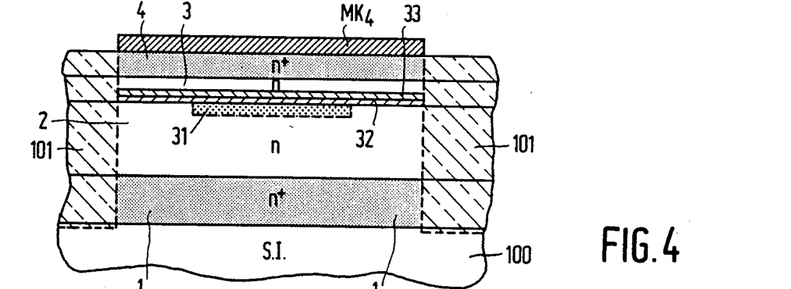
FIG. 4 shows a variation of the method according to the invention.

The method according to the invention can moreover comprise the step of forming a layer intended to avoid the diffusion of p-type charge carriers from the base layer 31 to the emitter layer 3. For this purpose, this method then comprises between the step c/ and the step (d) a step (c'), such as:

(c') Forming an epitaxial layer 32 at the surface of the layer 2 of intentionally undoped or weakly p-doped GaAs having a thickness of the order of 10 to 20 nm to avoid the diffusion of the p-type charge carriers from the layer 3 (cf. FIG. 4).

The method according to the invention can also comprise a step c" between the step (c') and the step (d) such as:

(c") Forming an epitaxial layer 33 of GaAlAs having a composition gradient of Al of from 0 to 25% so as to obtain a gradual hetero-junction between the emitter and the base, which permits of obtaining a higher current amplification (FIG. 4).

The method according to the invention can also comprise between the step (g) and the step (h) a step (g') such as:

(g') implanting in the openings $B_0$ oxygen ions for insulation zones 34 under the extrinsic base zones and thus reducing the base-collector capacitance, which permits of improving the frequency response of the transistor. The favourable concentration of implanted oxygen will be from $5 \cdot 10^{16}$ cm$^{-3}$ to $5 \cdot 10^{18}$ cm$^{-3}$. The implantation depth will be in the zone between the layer 31 and the layer 1 (cf. FIG. 2f).

FIG. 1b shows in plan view an embodiment of the device. The broken line represents the edges of the mask $MK_4$ which covered the active zone during the step (d') and which therefore defines this active zone.

Other forms of the transistor and especially numerous other configurations of the electrodes are possible without departing from the scope of the present invention.

Finally, instead of forming the insulation of the active zone during the step (d'), this insulation may be formed during an ultimate step (m') by implantation of protons or boron around a mask covering the active zone of the transistor.

Preferential values for the different dimensions used in the method are given below:

$B_0 = 1$ to $2$ μm
$E_1 = 0.9$ to $1.6$ μm
$h_1 \simeq 0.2$ to $0.3$ μm
$E_0 \simeq 0.5$ to $1$ μm The base layer may also be obtained in a variation according to the invention by replacing the step (c) known from the prior art by a step ($c_0$) such as:

($c_0$) forming an epitaxial layer $31'$ of a binary material of the group III-V of the p+conductivity type to obtain a base layer followed by etching around a mask defining the base zone down to the upper level of the collector layer 2. The etching step may be a dry or a wet etching step. The base zone $31'$ is then present in relief on the collector layer 2. The method is further effected as described above. The thickness of the p+layer $31'$ is of the order of 0.1 μm. The device obtained is therefore quasi planar.

Other III-V materials may be envisaged to obtain the transistor provided that the conditions necessary to obtain the heterojunctions are taken into account.

What is claimed is:

1. A method of manufacturing a semiconductor device of the hetero-junction bipolar transistor type having a planar structure, said method comprising at least the step of manufacturing a structure comprising successively at least one collector layer of a binary material of a first conductivity type, a base layer of a binary material of the second conductivity type opposite to the first type, an emitter layer of a ternary material of the first conductivity type and a binary highly doped contact layer of the first conductivity type, characterized in that it moreover comprises the steps of:

(a) depositing a layer of silicon nitride ($Si_3N_4$), (b) positioning a mask $MK_2$ defining openings normal to the base regions and etching the layer of silicon nitride ($Si_3N_4$) through these openings until the surface of the contact layer is exposed by a method which permits of obtaining etching edges perpendicular to the plane of the layers, thus forming in the nitride layer openings remote from each other, (c) localized implanting of ions of the second conductivity type through the openings of the nitride layer with an energy sufficient to attain the base layer so as to form islands of the second conductivity type connecting the base layer to the surface of the contact layer, (d) depositing a metallic layer which is formed in the openings as well as on the remaining parts of the nitride ($Si_3N_4$) layer, (e) forming a layer of silica ($SiO_2$) of very large thickness and then planarizing through a known method the device thus obtained down to the upper level of the nitride ($Si_3N_4$) layer by reactive ion etching (RIE) and ion machining, (f) selectively etching the remaining parts of the nitride ($Si_3N_4$) layer to maintain pads of silica ($SiO_2$) covering the base metallizations, (g) depositing a fresh layer of silicon nitride ($Si_3N_4$) and forming by a known method spacers formed in this new layer of nitride, which spacers bear on the edges of the silica ($SiO_2$) pads intended to reduce the distance between these pads of silica thus forming an opening defining the width of the emitter contact, these spacers also defining the distance between the collector, base and emitter electrodes, (h) depositing a metallic layer suitable to form the emitter and collector contacts, the pads of silica ($SiO_2$) and the spacers serving as masks, and then eliminating these dielectric parts, and (i) localized ion implanting between the collector base and emitter contacts serving as masks of species suitable to form insulating islands between these electrodes with an energy permitting of conductivity type.

2. A method as claimed in claim 1, characterized in that the structure of the collector, base and emitter layers is formed on a semi-insulating substrate and in that in this structure:
the collector is constituted by the superposition of two binary layers of the first conductivity type, the first of which is highly doped,
the base layer is formed by a localized implantation of ions of the second conductivity type in the superficial region of the second collector layer,
islands connecting the first collector layer to the contact layer are formed by a localized implantation into a region chosen to form the collector to ions of the first conductivity type.

3. A method as claimed in claim 1 or 2, characterized in that the transistors is insulated by an ion implantation suitable to form insulation regions defining the active zone of the transistor, the latter being masked during this operation.

4. A method as claimed in claim 1 or 2, characterized in that a not intentionally doped binary layer is formed between the base layer and the ternary emitter layer to avoid the diffusion of the charge carriers from the binary base layer to the ternary emitter layer.

5. A method as claimed in claim 4, characterized in that a ternary layer having a composition gradient is formed between the binary not intentionally doped layer and the ternary emitter layer to obtain a gradual hetero-junction between the emitter and the base.

6. A method as claimed in claim 1 or 2, characterized in that it comprises between the step (b) and the step (c) a step (b')

(b') implantation in the openings of ions suitable to form insulating zones under the base region.

7. A method as claimed in claim 2, characterized in that:
the substrate consists of semi-insulating gallium arsenide (GaAs) orientated in a crystallographic direction [100]:
the binary layers consist of gallium arsenide (GaAs);
the ternary layers consist of gallium aluminum arsenide (GaAlAs) having, a composition gradient of the element Al when this gradient is provided;
the first conductivity type is the n-type;
the second opposite conductivity type is the p-type.

8. A method as claimed in claim 7, characterized in that, in order to obtain the n+or n-conductivity type, the layers are doped by means of Si+ions.

9. A method as claimed in claim 7 or 8, characterized in that, in order to obtain islands of the n+conductivity type, the ion implantation provided is effected by means of Si+ions.

10. A method as claimed in claim 1 or 2, characterized in that, in order to obtain zones of the p+'l conductivity type, the ion implantation provided is effected by means of ions among Be, Mg, Zn and among an associaton of F with Be or P with Mg.

11. A method as claimed in claim 1 or 2, characterized in that the metallic layer deposited during the step d) to form the base contacts is chosen among the compounds Au-Mn, Au-Be, Au-Zn, and in that the metallic layer deposited during the step h) to form the emitter and collector contacts is a multi-layer of Au-Ge and on it Ni.

12. A method as claimed in any one of claims 3, characterized in that, in order to form the insulating zones, oxygen (0+) ions are implanted.

13. A method as claimed in claim 1 or 2, characterized in that, in order to form the insulating zones between the electrodes, during the step (i) elements are implanted chosen among B ions, O ions and protons.

14. A method as claimed in claim 1 or 2, characterized in that the base layer is an additional layer of a binary material of the group III-V of the second conductivity type with an etching treatment around a mask defining the base zone down to upper level of the collector layer.

* * * * *